(12) United States Patent
Duclos et al.

(10) Patent No.: US 9,737,909 B2
(45) Date of Patent: Aug. 22, 2017

(54) MACHINE FOR THE PLASMA TREATMENT OF CONTAINERS, COMPRISING OFFSET DEPRESSURIZATION/PRESSURIZATION CIRCUITS

(75) Inventors: Yves-Alban Duclos, Octeville sur Mer (FR); Laurent Danel, Octeville sur Mer (FR); Naima Boutroix, Octeville sur Mer (FR)

(73) Assignee: SIDEL PARTICIPATIONS, Octeville sur Mer (FR)

( * ) Notice: Subject to any disclaimer, the term of this patent is extended or adjusted under 35 U.S.C. 154(b) by 1803 days.

(21) Appl. No.: 12/446,055

(22) PCT Filed: Oct. 17, 2007

(86) PCT No.: PCT/FR2007/001718
§ 371 (c)(1),
(2), (4) Date: Jul. 22, 2009

(87) PCT Pub. No.: WO2008/050002
PCT Pub. Date: Feb. 5, 2008

(65) Prior Publication Data
US 2010/0206232 A1 Aug. 19, 2010

(30) Foreign Application Priority Data
Oct. 18, 2006 (FR) ...................... 06 09140

(51) Int. Cl.
*B05D 7/22* (2006.01)
*C23C 16/04* (2006.01)
(Continued)

(52) U.S. Cl.
CPC .............. *B05D 7/227* (2013.01); *B05D 1/62* (2013.01); *C23C 16/045* (2013.01);
(Continued)

(58) Field of Classification Search
None
See application file for complete search history.

(56) References Cited

U.S. PATENT DOCUMENTS 5,849,366 A * 12/1998 Plester .......................... 427/491
6,924,001 B2 * 8/2005 Hama et al. .................. 427/237
(Continued)

FOREIGN PATENT DOCUMENTS

WO          03/100122 A2    12/2003
WO     WO 2006000539 A1 *  1/2006  .......... C23C 16/045

*Primary Examiner* — Karla Moore
(74) *Attorney, Agent, or Firm* — Sughrue Mion, PLLC (57) ABSTRACT

Machine (1) for the plasma treatment of containers (3), which comprises: a chamber (5) suitable for receiving a container (3) to be treated, a cover (8) defining a nozzle (9) in the extension of the chamber (5); a duct (14) for depressurization the container (3), which duct opens into the nozzle (9) and connects the latter to a vacuum source (15); a first valve (19) having a closed position, in which it closes off the depressurization duct (14), and an open position, in which it brings the nozzle (9) and the vacuum source (15) into communication; a duct (27) for pressurizing the container (3), separate from the depressurization duct (14), this pressurization duct (27) emerging in the nozzle (9) beyond the depressurization duct (14) and connecting the nozzle (9) to a pressure source (28); and a second valve (29) having a closed position, in which it closes off the pressurization duct (27), and an open position, in which it brings the nozzle (9) and the pressure source (28) into communication.

6 Claims, 7 Drawing Sheets (51) Int. Cl.
 *B05D 1/00* (2006.01)
 *C23C 16/44* (2006.01)
 *C23C 16/50* (2006.01)
(52) U.S. Cl.
 CPC .......... *C23C 16/4412* (2013.01); *C23C 16/50* (2013.01); *B05D 2201/02* (2013.01)

(56) References Cited

U.S. PATENT DOCUMENTS

| | | | |
|---|---|---|---|
| 7,603,962 B2* | 10/2009 | Hama et al. | 118/723 E |
| 2005/0227019 A1* | 10/2005 | Hama et al. | 427/581 |
| 2008/0035613 A1* | 2/2008 | Duclos | C23C 16/045 219/121.47 |

* cited by examiner

MACHINE FOR THE PLASMA TREATMENT OF CONTAINERS, COMPRISING OFFSET DEPRESSURIZATION/PRESSURIZATION CIRCUITS

The invention relates to the treatment of containers, consisting of coating their inner wall with a layer of a barrier effect material.

The depositing of barrier effect material by plasma enhanced chemical vapor deposition (PECVD) is known. Customarily, a machine equipped with a plurality of treatment units is used, each of which is comprised of at least one electromagnetic wave generator, a chamber connected to the generator and made of a conductive material (generally metal), as well as an enclosure provided in the chamber and made of a material (generally quartz) that is transparent to the electromagnetic waves produced by the generator.

After insertion of the container (generally made of a thermoplastic polymer material such as PET) into the enclosure, a depressurization is performed to establish in the container a high vacuum (several μbars, 1 μbar being equal to $10^{-6}$ bar) necessary to establish the plasma, and in the enclosure outside the container a medium vacuum (on the order of 30 mbar to 100 mbar) to prevent the container from contracting from the effect of the difference in pressure on either side of its wall.

A precursor gas (such as acetylene, $C_2H_2$) is then introduced into the container, said precursor being activated by electromagnetic bombardment (this generally involves low power UHF microwaves at 2.45 GHz) in order to cause it to go through the cold plasma state and thus generate species including hydrogenated carbon (including CH, $CH_2$, $CH_3$), which is deposited in a thin layer (whose thickness is customarily between 50 and 200 nm, depending on the case, 1 nm being equal to $10^{-9}$ m) on the inner wall of the container.

The plasma is generated for a predetermined length of time (on the order of a few seconds) during which the depressurization of the container is continued in order to draw out the undeposited species via an evacuation duct. The precursor gas feed, electromagnetic bombardment and depressurization are then stopped; the container, then the enclosure, are pressurized; finally, the container is evacuated.

Uncontrolled pressurization (for example simply opening the enclosure to open air) could lead to a momentary imbalance between the internal and external pressures of the container, causing a contraction of said container and its subsequent rejection. This is the reason it is essential to control the pressurization of the enclosure and of the container, prior to the evacuation thereof. One widely used method consists of equipping the evacuation duct of the machine with a three-way valve connecting the container (or enclosure) either to a vacuum source or to the open air (i.e. to atmospheric pressure). An illustration of this principle can be found in U.S. Pat. No. 5,849,366 (The Coca-Cola Company).

Although this method has the dual advantage of simplicity and compactness, it has at least two flaws. Firstly, the pressurization causes the reinjection into the container of particles which, during the treatment, are deposited in the evacuation duct. These particles form a deposit in the container, which then must be cleaned out before proceeding with the filling thereof. Secondly, a carbonaceous deposit is formed even in the electrically operated valve, including in the open air channel. This flaw can, over time, affect the seal of this channel and lead to the appearance of harmful leaks upon depressurization of the container. The electrically operated valve must therefore be cleaned (or replaced) frequently, with the consequent shutdown of the machine and restriction of productivity.

The invention seeks in particular to correct these flaws by proposing a machine that can limit the pollution of the containers at the end of treatment, while guaranteeing good quality depressurization during said treatment.

To that end, the invention proposes a machine for treating containers by plasma, which comprises:
  an enclosure suitable for receiving a container to be treated,
  a cover defining a nozzle in the extension of the enclosure;
  a duct for the depressurization of the container, which opens into the nozzle and connects said nozzle to a vacuum source;
  a first valve having a closed position in which it closes off the depressurization duct, and an open position in which it brings the nozzle and the vacuum source into communication;
  a pressurization duct distinct from the depressurization duct, which pressurization duct opens into the nozzle beyond the depressurization duct and connects the nozzle to a pressure source; and
  a second valve having a closed position in which it closes off the pressurization duct, and an open position in which it places the nozzle in communication with the pressure source.

In this way, the pressurization duct is protected from particles produced by the plasma, which decreases the pollution created in the container by the pressurization at the end of the treatment, and ensures a more durable seal of the second valve, resulting in better quality vacuum in the container during treatment.

According to one embodiment, the nozzle has a central portion into which the depressurization duct opens, for example by means of an annular chamber communicating with the nozzle by an openwork partition. Said central portion is extended by a terminal portion into which the pressurization duct opens, for example by means of an annular chamber communicating with the central portion by one or more holes.

According to one embodiment, the machine can further comprise a duct for the depressurization of the enclosure, independent of the depressurization duct of the container and which connects the enclosure to a vacuum source, and a duct for pressurizing the enclosure, independent of the pressurization duct of the container and which connects the enclosure to a pressure source. The depressurization duct and the pressurization duct of the enclosure open into a common channel, for example, which opens into the enclosure.

Other objects and advantages of the invention will appear from the following description, provided with reference to the appended drawings in which.

Figure 1:
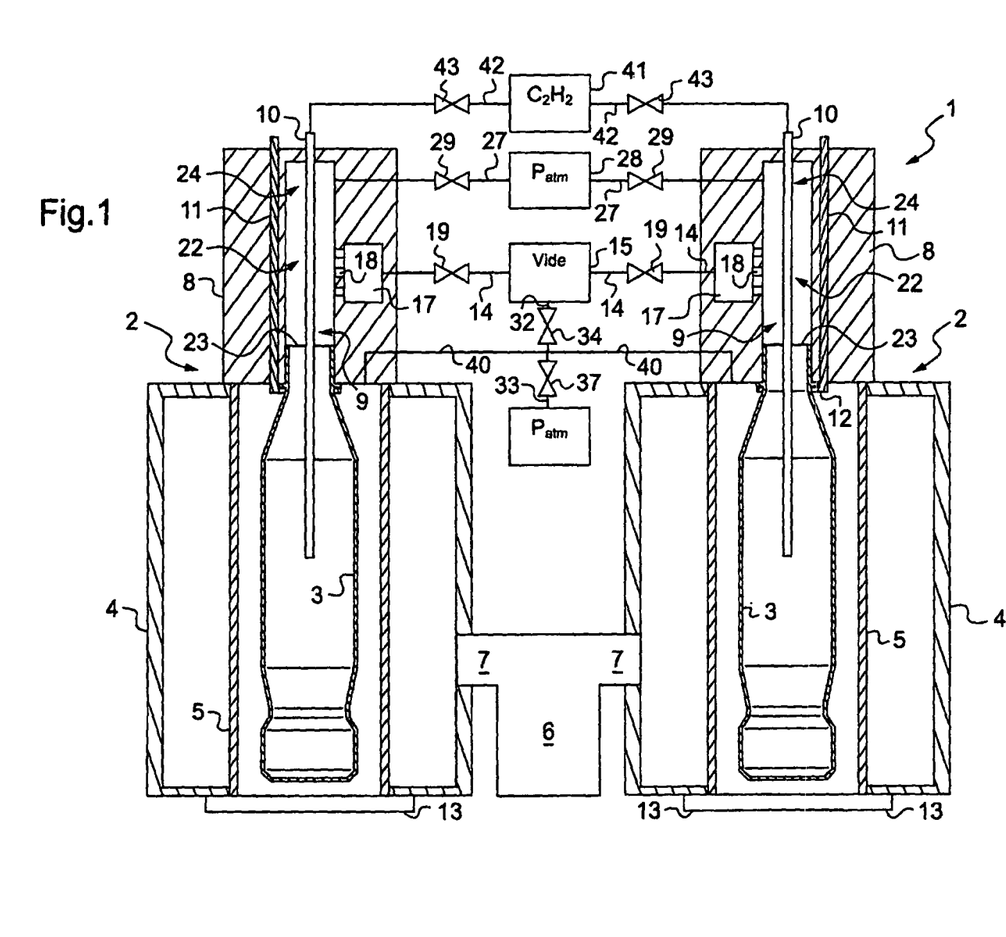
FIG. 1 is a diagrammatical view in cross section showing a machine according to the invention.
Figure 2:
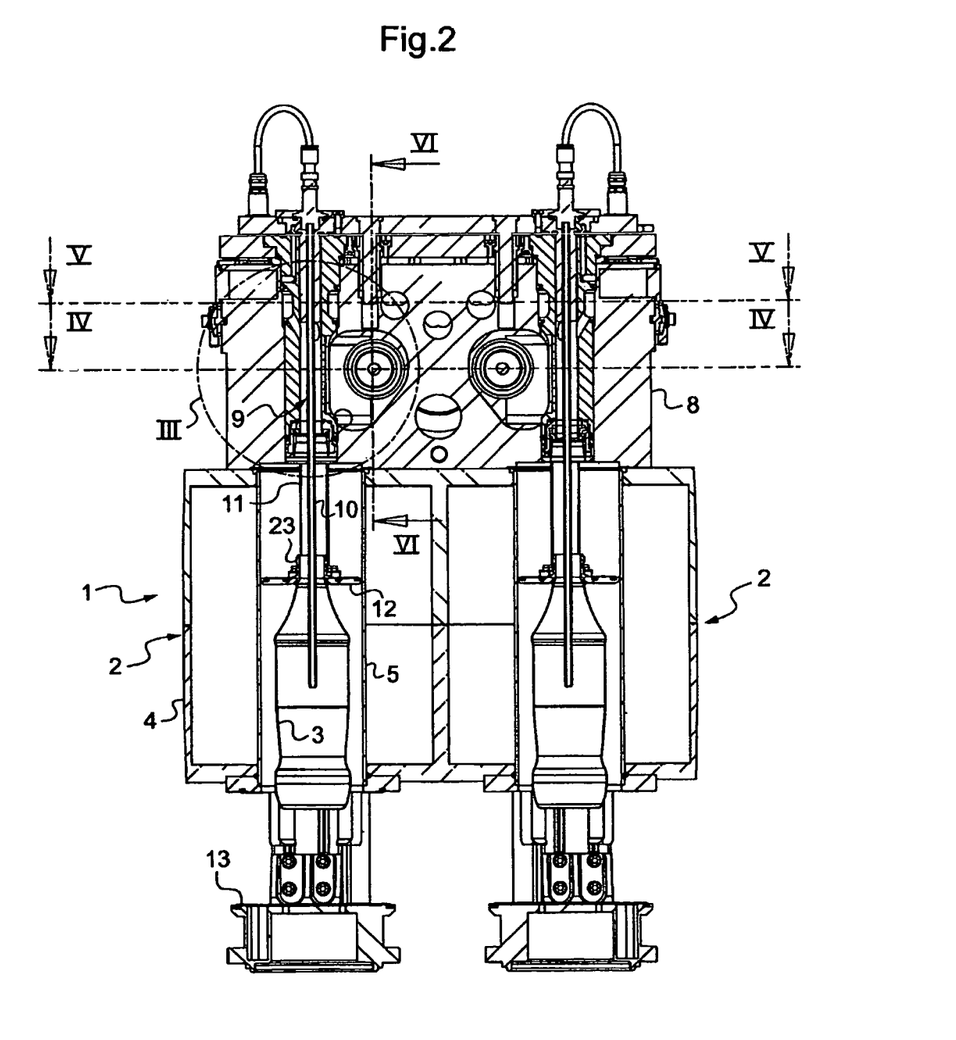
FIG. 2 is an elevation view in cross section showing an embodiment of the machine according to the invention.

Represented in FIG. 1 is a machine 1 comprising two paired treatment units 2 for the plasma deposition of a barrier layer on the inner wall of containers 3 previously produced by blowing or stretch-blowing preforms of plastic material such as PET. The treatment units 2 are mounted at the periphery of a rotating carrousel (not shown) that can be disposed directly at the output of a container blowing machine.

Each treatment unit 2 comprises a chamber 4 made of a conductive material such as steel or preferably aluminum or aluminum alloy. Disposed in the chamber 4 is an enclosure 5 made of a material transparent to electromagnetic waves, such as quartz. The machine 1 also comprises a low-power generator 6 of electromagnetic microwaves at a frequency of 2.45 GHz, connected by waveguides 7 to each pair of chambers 4 of the treatment units 2.

Each chamber 4 is topped by a cover 8 which, in the extension of the enclosure 5 at an upper end thereof, defines a nozzle 9 through which an injector 10 passes for the introduction of a precursor gas such as acetylene into the container.

A rod 11, provided at a lower end with a device 12 for clamping the containers 3 by the neck, passes through the cover 8. At a lower end, the enclosure 5 is sealed closed by a cap 13. The cap 13 and the rod 11 are jointly and slidably mounted between an upper position, called closed (FIG. 1), wherein the cap closes the enclosure and the clamp presses the container against the cover, the mouth thereof being at least partially received into the nozzle, and a lower position, called open, wherein the cap 13 opens the enclosure 5 and the clamp 12 is located below the lower end of the enclosure 5, in order to allow a treated container 3 to be evacuated and the next container to be loaded.

Each treatment unit 2 further comprises a duct 14 for the depressurization of the container 3, which duct connects the nozzle 9 to a vacuum source 15 by means of channels 16 formed partly inside the treatment unit 2 and partly outside said unit. The vacuum source 15, in practice composed of a pump unit that is common to all of the treatment units 2, can be disposed outside the machine 1.

The duct 14 for depressurization of the container 3 opens into the nozzle 9. More specifically, the duct 14 opens into an intermediate chamber 17, formed in the thickness of the cover 8 and which communicates with the nozzle 9 by an openwork partition with holes drilled therein.

Figure 4:
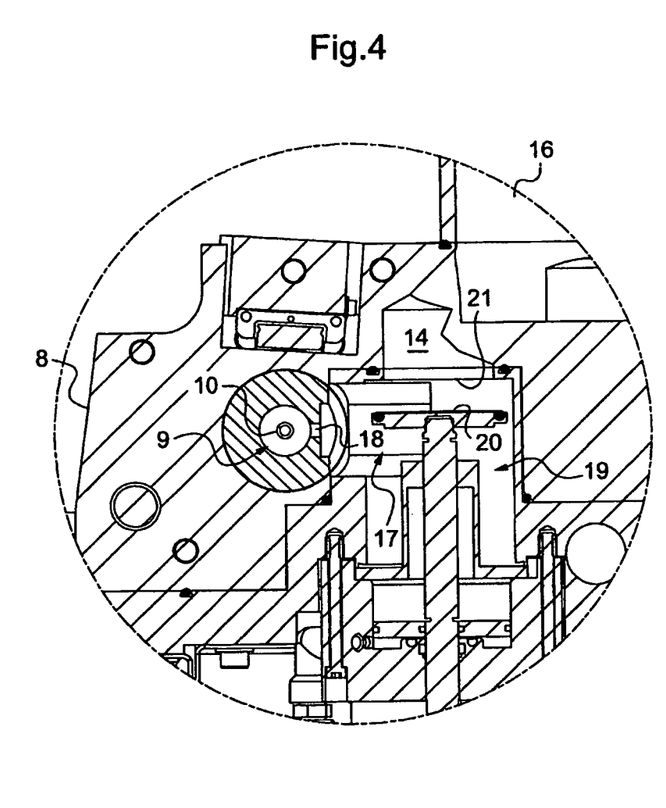
FIG. 4 is a detailed view in transverse cross section of the machine of FIG. 2, along sectional plane IV-IV.

The treatment unit 2 comprises a first electrically operated valve 19, inserted between the nozzle 9 and the vacuum source 15 in order to allow or prevent communication between them, depending on the stage of progress of the treatment. Said electrically operated valve 19 comprises a valve 20 which extends through the intermediate chamber 17 and is mounted movably between a closed position in which it is applied against a valve seat 21 formed at the mouth of the depressurization duct 14 which it thus closes, preventing communication between the nozzle 9 and the vacuum source 15, and an open position (FIG. 4) in which, moved away from the seat 21, it places the nozzle 9 and the vacuum source 15 in communication.

The nozzle 9 has a central portion 22, formed by a bore that extends from the junction of the nozzle 9 with the enclosure 5 (i.e., when a container 3 is received therein, from the mouth 23 of the container 3) to the upper limit of the openwork partition 18. Said central portion 22 constitutes a post-discharge zone flooded by the plasma, which plasma, however, is confined in the nozzle 9 by the presence of the partition 18 which, by a judicious choice of thickness and diameter of holes, forms a barrier to the electromagnetic waves which preserves the intermediate chamber 17 from the plasma.

Figure 3:
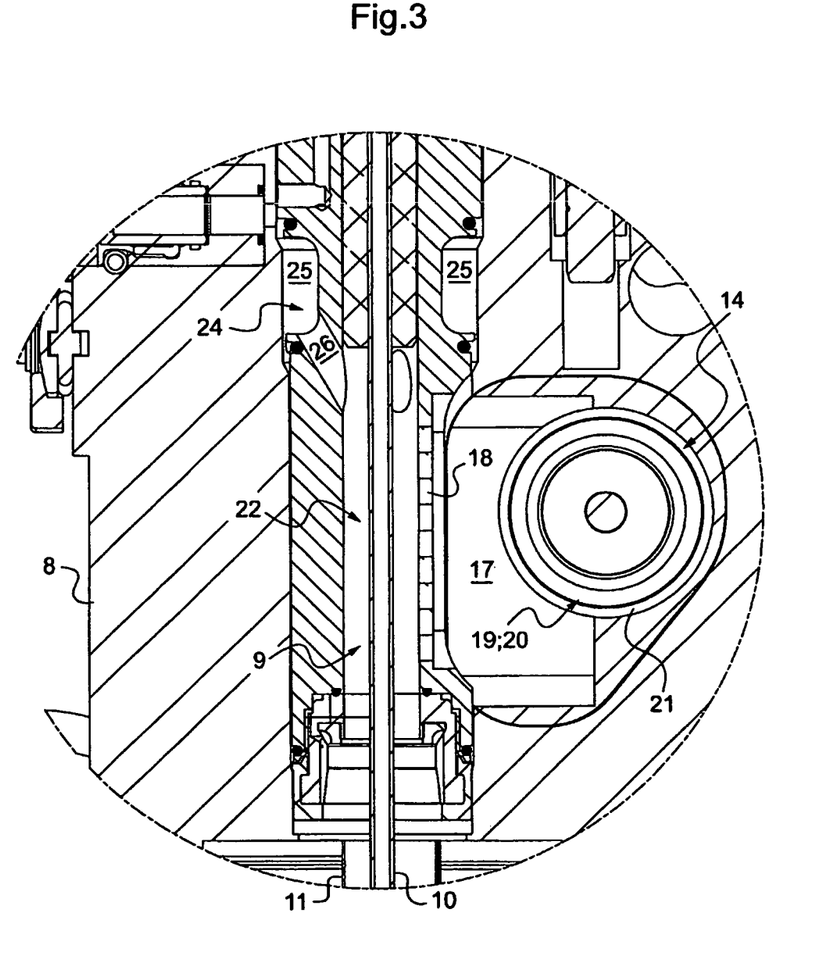
FIG. 3 is a large-scale detailed view of the machine of FIG. 2, per inset III.

The nozzle 9, in the extension of the central portion 22, that is, beyond the depressurization duct 14, has a terminal portion 24 which comprises an annular chamber 25 connected to the bore of the central portion 22 by one or more oblique holes 26 forming zigzags (FIG. 3).

The treatment unit 2 further comprises a duct 27 for pressurization of the container 3, distinct from the depressurization duct 14. The pressurization duct 27 connects the nozzle 9 to a pressure source 28 which can be open air or a source of gas (such as air or another neutral gas) at a pressure equal to (or nearly equal to) the atmospheric pressure. Said pressurization duct 27 opens into the terminal portion 24 of the nozzle 9, that is, beyond the pressurization duct 14. More specifically, the pressurization duct 27 opens into the annular chamber 25.

Figure 5:
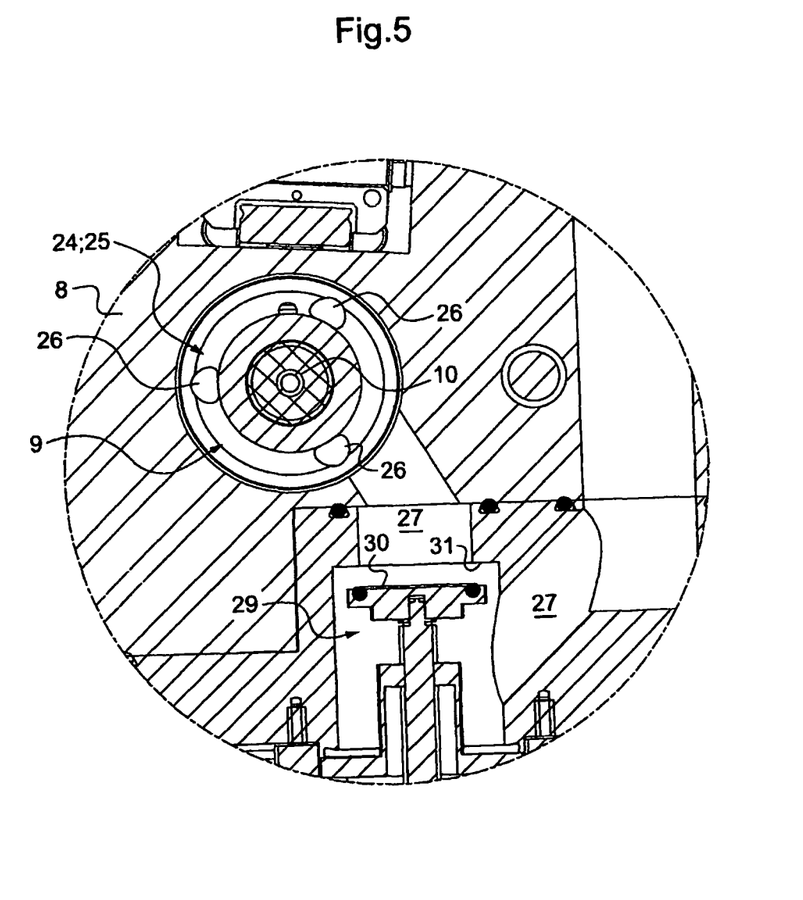
FIG. 5 is a detailed view in transverse cross section of the machine of FIG. 2, along a sectional plane V-V.

The treatment unit 2 comprises a second electrically operated valve 29, inserted between the nozzle 9 and the pressure source 28 in order to allow or prevent communication between them, depending on the stage of progress of the treatment. Said electrically operated valve 29 comprises a valve 30 mounted movably between a closed position in which it is pressed against a valve seat 31 formed at the mouth of the pressurization duct 27 which it thus blocks, preventing communication between the nozzle 9 and the pressure source 28, and an open position (visible in FIG. 5) where, moved away from the seat 31, it places the nozzle 9 and the pressure source 28 in communication.

Thanks to this arrangement, during treatment of the container 3 the plasma, drawn through the partition 18 to the intermediate chamber 17 due to the vacuum caused by opening the electrically operated valve 19, does not reach the terminal portion 24 of the nozzle 9. Therefore, little or no carbonaceous species are deposited, not only in this terminal portion 24, but also on the electrically operated valve 29 and the seat 31. This results in a two-fold advantage. On the one hand, during the pressurization of the container 3 which follows the deactivation of the plasma by the cutoff of the electromagnetic microwaves, the air that surges through the pressurization duct 27 into the container 3 via the nozzle 9 carries few particles, which minimizes or eliminates the pollution of the container 3 at the end of treatment. On the other hand, the seal achieved by the closing of the second electrically operated valve 29 is preserved, to the benefit of the quality of the vacuum produced in the container 3 by the depressurization (during which the electrically operated valve 29 is kept closed).

Moreover, it is provided that the pressurization as well as the depressurization, inside both the container 3 and the enclosure 5 (outside the container 3), are performed separately.

To that end, the machine 1 comprises, for each treatment unit 2, a duct 32 for the depressurization of the enclosure 5, separate from the duct 14 for the depressurization of the container 3, and a duct 33 for the pressurization of the enclosure 5, separate from the duct for the pressurization of the container 3.

The depressurization duct 32 connects the enclosure 5, outside the container 3, to a vacuum source 15, which can be the same as the one to which the container 3 is connected via the duct 14.

The treatment unit 2 comprises a third electrically operated valve 34 inserted between the enclosure 5 and the vacuum source 15 to allow or prevent communication between them. Said electrically operated valve 34 comprises a valve 35 mounted movably between a closed position in which it is applied against a valve seat 36 formed at the mouth of the depressurization duct 32 that it closes off, preventing communication between the enclosure 5 and the vacuum source 15, and an open position (visible in FIG. 6) in which, moved away from the seat 36, it places the enclosure 5 in communication with the vacuum source 15.

The pressurization duct 33 connects the enclosure 5, outside the container 3, to a pressure source 28 which can be open air or a source of gas (such as air or other neutral gas) at a pressure equal (or nearly equal) to the atmospheric pressure. Said pressure source 28 can be the same as the one to which the container 3 is connected via the duct 27.

The treatment unit 2 comprises a fourth electrically operated valve 37 inserted between the enclosure 5 and the pressure source 28 to allow or prevent communication between them. Said electrically operated valve 37 comprises a valve 38 mounted movably between a closed position in which it is applied against a valve seat 39 formed at the mouth of the pressurization duct 33 which it thus closes off, preventing communication between the enclosure 5 and the pressure source 28, and an open position (visible in FIG. 6) in which, moved away from the seat 39, it places the enclosure 5 in communication with the pressure source 28.

Figure 6:
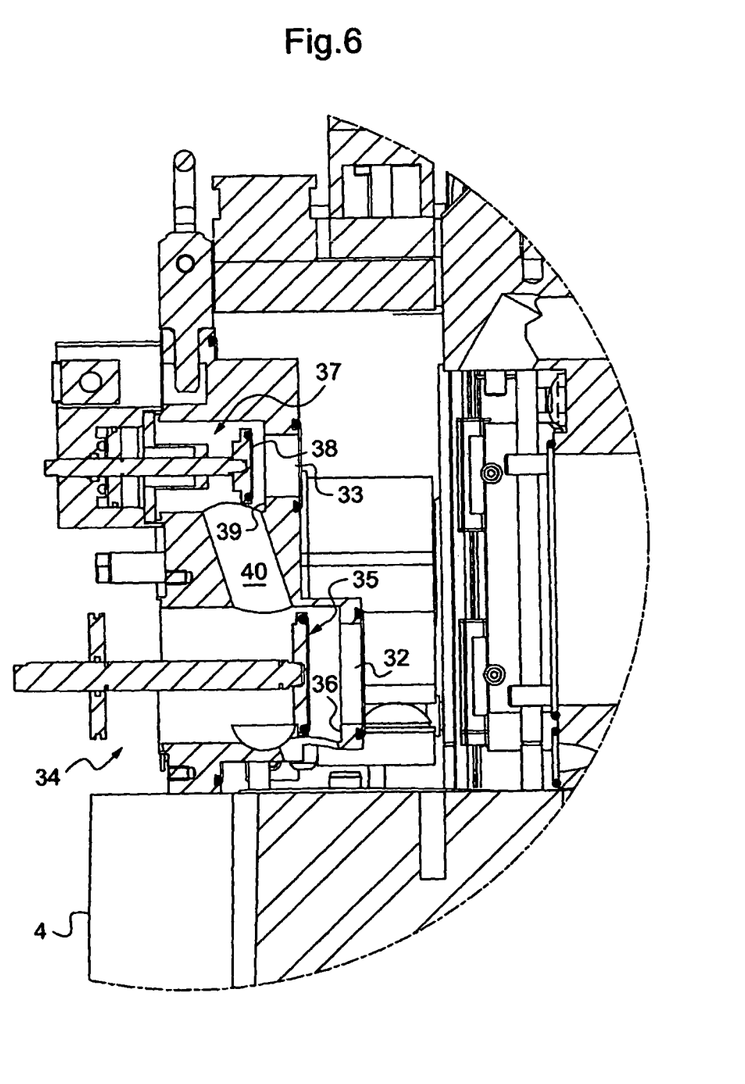
FIG. 6 is a detailed elevation view in cross section of the machine of FIG. 2, along the sectional plane VI-VI.

As shown in FIGS. 1 and 6, the depressurization duct 32 and the pressurization duct 33 of the enclosure 5 both open into a common channel 40 which opens into the enclosure 5, outside the container 3.

The injector 10 is connected to a source 41 of precursor gas (such as acetylene) by a duct 42 formed partly in the cover 8 and which can be opened or closed by a fifth electrically operated valve 43.

According to an embodiment illustrated in FIG. 1, the depressurization duct 32 and the pressurization duct 33 of the enclosure 5, as well as the third electrically operated valve 34 and the fourth electrically operated valve 37, are common to the same pair of treatment units 2, resulting in a compactness of the machine 1.

Figure 7:
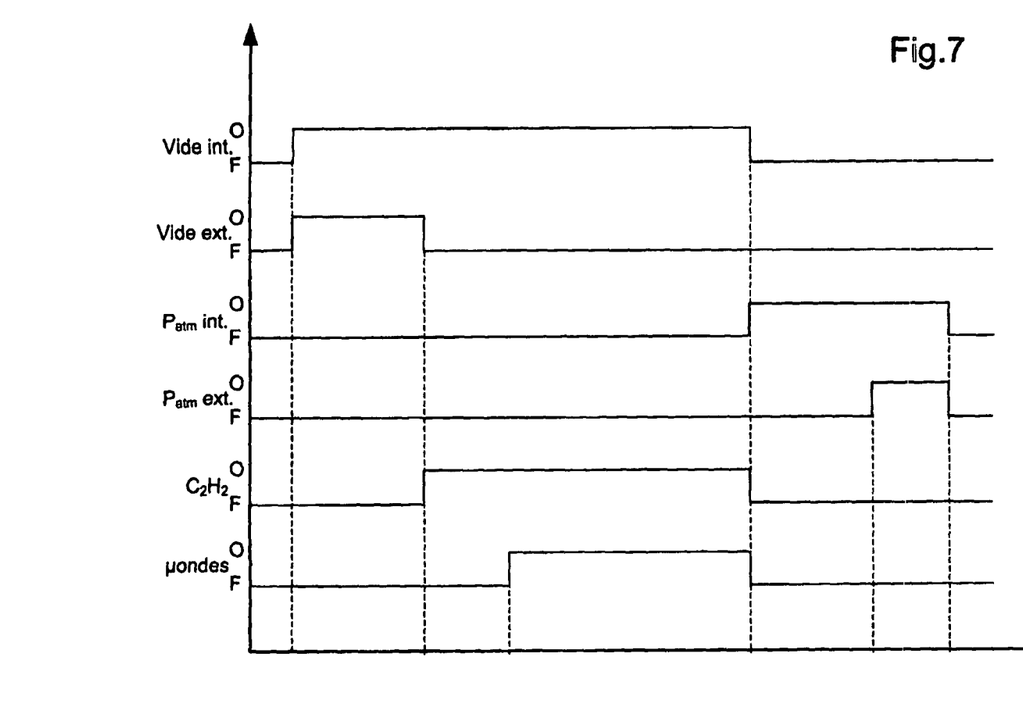
FIG. 7 is a timing chart illustrating the sequence of a method of treating containers by means of a machine according to the invention.

The electrically operated valves 19, 29, 34, 37, 43 are controlled by a control unit (not shown) which controls the automated functions of the machine during the treatment, the principal steps of which are now described with reference to FIG. 7, in which:

the line entitled Vide in [Int. Vac.] designates the condition, open (O) or closed (F) of the first electrically operated valve 19;

the line entitled Vide ext. [Ext. Vac.] designates the condition, open (O) or closed (F) of the third electrically operated valve 34;

the line entitled "$P_{atm}$ int." designates the condition, open (O) or closed (F) of the second electrically operated valve 29;

the line entitled "$P_{atm}$ ext." designates the condition, open (O) or closed (F) of the fourth electrically operated valve 37;

the line entitled "$C_2H_2$" designates the condition, open (O) or closed (F) of the fifth electrically operated valve 43, allowing the injection of acetylene into the container 3; and the line entitled "µondes" [µwaves] designates the condition, active (O) or inactive (F) of the microwave generator 6.

The cap 13 and the rod 11 are initially in the lower position to allow a container 3 to be loaded. The enclosure 5 with no container 3 therein is thus open to the air.

A container 3 is loaded, its neck held in the clamping device 12. The rod 11 rises, together with the cap 13, to the upper position where the container 3 is held rigidly sealed between the clamping device 12 and the cap 8. The purpose of said seal is to prevent any communication between the nozzle 9 (and thus the interior of the container 3) and the enclosure 5 (i.e., the exterior of the container 3) in order to prevent the carbonaceous pollution of the enclosure 5, which would be detrimental to the good transmission by the enclosure of the electromagnetic microwaves.

At the moment the rod 11 and the cap 13 reach their upper position, the valves 30 and 38 of the second electrically operated valve 29 and fourth electrically operated valve 37 are in the closed position (see lines $P_{atm}$ int. and $P_{atm}$ ext.). That moment serves as the origin on the time axis (abscissa) of the timing chart of FIG. 7.

At that moment (or after a time-out, if any), the valves 20, 35 of the first electrically operated valve 19 and third electrically operated valve 34, controlled by the control unit, change to the open position to provide the depressurization of the interior of the container 3 and of the enclosure 5 (outside of the container 3) by placing them in communication with the vacuum source 15 (see lines Vide in [Int. Vac.] and Vide ext. [Ext. Vac.]). When the pressure in the enclosure 5 (outside the container 3) has reached the desired value (several dozen mbar), the valve 35 of the third electrically operated valve 34 changes, under the control of the control unit, to the closed position so that the pressure in the enclosure 5 is maintained at that value (see the line Vide ext. [Ext. Vac.]), while the valve 20 of the first electrically operated valve 19 is held in the open position to continue the depressurization of the interior of the container 3.

At that moment, the fifth electrically operated valve 43 is opened by the control unit in order to introduce the precursor gas into the container 3 via the injector 10 (see line $C_2H_2$).

After a time-out to allow the precursor gas to occupy the entire volume of the container 3, the microwave generator 6 is activated, which causes the genesis of a cold plasma in the interior of the container, the ionized species of which plasma are deposited in a thin film on the inner wall of the container 3, thus forming a barrier layer thereon.

Throughout the duration of the plasma, the valve 20 of the first electrically operated valve 19 is kept open so as to continue the depressurization of the container 3 and thus evacuate the species generated by the plasma that would not be deposited on the wall of the container 3. As we have already mentioned, although the focus of the plasma is located in the container 3, the plasma is propagated in the nozzle 9, and more specifically in the central portion 22 (post-discharge zone) perpendicular to the partition 18 through which the undeposited species are drawn, however without the plasma reaching the terminal portion 24 of the nozzle 9.

After a predetermined period of time (on the order of a few seconds), the control unit simultaneously controls:

the deactivation of the electromagnetic microwave generator 6, causing the clearing of the plasma;

the closing of the fifth electrically operated valve 43, causing the precursor gas feed to stop;

the change of the valve 20 of the first electrically operated valve 19 to the closed position, causing the depressurization of the container 3 to stop; and the change of the valve 30 of the second electrically operated valve 29 to the open position, causing the pressurization of the container 3.

After a predetermined time-out (a fraction of a second), the control unit controls the change of the valve 38 of the fourth electrically operated valve 37 to the open position, causing the pressurization of the enclosure 5 outside the container 3.

The container 3 thus treated can then be evacuated, the cycle being repeated for the treatment of the next container.

The invention claimed is:

1. A machine for treating containers by plasma, comprising:
    an enclosure suitable for receiving a container to be treated,
    a cover defining a nozzle in an extension of the enclosure where the container is held rigidly sealed to the cover during plasma treatment, in order to prevent any communication between the nozzle and the enclosure, whereby communication between an interior of the container and an exterior of the container is prevented;
    a duct for the depressurization of the container, having a terminal end disposed in the cover so as to connect said nozzle to a vacuum source;
    a first valve having a closed position in which the first valve closes off the depressurization duct, and an open position in which first valve brings the nozzle and the vacuum source into communication;
    a duct for the pressurization of the container, distinct from the depressurization duct, having a terminal end disposed in the cover so as to connect the nozzle to a pressure source, the terminal end of the depressurization duct being disposed in a portion of the cover between the terminal end of the pressurization duct and the container, so that gas that surges between the depressurization duct and the container does not flow by the terminal end of the pressurization duct;
    a second valve having a closed position in which it closes off the pressurization duct, and an open position in which it places the nozzle in communication with the pressure source, so that gas which passes through the second valve flows only out through the terminal end of the pressurization duct;
    an intermediate chamber formed within a wall of the cover; and
    a partition wall having holes and disposed between the intermediate chamber and the nozzle, wherein the terminal end of the depressurization duct opens into the intermediate chamber and communicates with the nozzle via the partition wall,
    wherein the nozzle has a central portion and a terminal portion disposed above the central portion, so that the terminal end of the pressurization duct is connected to the terminal portion, wherein the central portion is formed by a bore that forms a post discharge zone and the terminal portion comprises an annular chamber connected to the bore of the central portion by oblique holes.

2. The machine as claimed in claim 1, wherein the terminal portion of the nozzle is formed in the cover, configured to allow gas to flow from the terminal end of the pressurization duct into the annular chamber.

3. The machine as claimed in claim 1, which further comprises a duct for the depressurization of the enclosure, independent of the duct for the depressurization of the container, and which connects the enclosure to a vacuum source.

4. The machine as claimed in claim 1, which further comprises a duct for pressurization of the enclosure, independent of the duct for pressurization of the container and which connects the enclosure to a pressure source.

5. The machine as claimed in claim 4, which further comprises a duct for the depressurization of the enclosure, independent of the duct for the depressurization of the container, and which connects to a vacuum source, wherein the depressurization duct and the pressurization duct for the enclosure open into a common channel which opens into the enclosure.

6. A plasma treatment system, comprising:
    an enclosure configured to receive a container to be treated;
    a cover extending from the enclosure, including a nozzle configured to introduce a precursor gas from a precursor source into the container, the container being held rigidly sealed to the cover during plasma treatment, in order to prevent any communication between the nozzle and the enclosure, such that an interior of the container cannot communicate with an exterior of the container in the enclosure;
    a gas duct configured to supply the precursor gas to the nozzle;
    a depressurization duct configured to depressurize the container, which connects the nozzle to a vacuum source;
    a first valve having a closed position in which it closes off the depressurization duct, and an open position in which it causes the nozzle and the vacuum source to communicate;
    a pressurization duct configured to pressurize the container, separate and distinct from the depressurization duct and the gas duct, which connects the pressurization duct to a pressure source, said pressurization duct connected to the nozzle at a position between the depressurization duct and the gas duct;
    a second valve having a closed position in which it closes off the nozzle, and an open position in which it causes the nozzle and the pressure source to communicate so that gas which passes through the second valve flows only out through the pressurization duct;
    an intermediate chamber formed within a wall of the cover; and
    a partition wall having holes and disposed between the intermediate chamber and the nozzle, wherein the terminal end of the depressurization duct opens into the intermediate chamber and communicates with the nozzle via the partition wall,
    wherein the nozzle has a central portion and a terminal portion disposed above the central portion, so that the terminal end of the pressurization duct is connected to the terminal portion, wherein the central portion is formed by a bore that forms a post discharge zone and the terminal portion comprises an annular chamber connected to the bore of the central portion by oblique holes.

* * * * *